United States Patent
Eshun et al.

(10) Patent No.: US 7,825,441 B2
(45) Date of Patent: Nov. 2, 2010

(54) JUNCTION FIELD EFFECT TRANSISTOR WITH A HYPERABRUPT JUNCTION

(75) Inventors: Ebenezer E. Eshun, Essex Junction, VT (US); Jeffrey B. Johnson, Essex Junction, VT (US); Richard A. Phelps, Colchester, VT (US); Robert M. Rassel, Colchester, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 659 days.

(21) Appl. No.: 11/767,627

(22) Filed: Jun. 25, 2007

(65) Prior Publication Data

US 2008/0315266 A1 Dec. 25, 2008

(51) Int. Cl.
*H01L 29/808* (2006.01)
*H01L 21/337* (2006.01)

(52) U.S. Cl. .............. 257/285; 257/E21.421; 257/E29.265; 438/194; 438/529

(58) Field of Classification Search .......... 257/285, 257/287, E21.421, E29.265; 438/194, 529
See application file for complete search history.

(56) References Cited

U.S. PATENT DOCUMENTS

| | | | |
|---|---|---|---|
| 4,226,648 A | 10/1980 | Goodwin et al. | |
| 4,827,319 A | 5/1989 | Pavlidis et al. | |
| 5,466,303 A | 11/1995 | Yamaguchi et al. | |
| 5,557,140 A | 9/1996 | Nguyen et al. | |
| 6,274,917 B1 | 8/2001 | Fan et al. | |
| 6,429,054 B1 * | 8/2002 | Krishnan et al. | 438/149 |
| 6,465,847 B1 * | 10/2002 | Krishnan et al. | 257/347 |
| 6,521,506 B1 | 2/2003 | Coolbaugh et al. | |
| 6,608,679 B1 | 8/2003 | Chen et al. | |
| 6,611,037 B1 | 8/2003 | Rhodes | |
| 6,774,436 B1 * | 8/2004 | Yu et al. | 257/347 |
| 6,930,336 B1 | 8/2005 | Merrill | |
| 2004/0207029 A1 | 10/2004 | Braddock | |
| 2005/0082480 A1 | 4/2005 | Wagner et al. | |
| 2005/0161770 A1 | 7/2005 | Coolbaugh et al. | |
| 2006/0038254 A1 | 2/2006 | Jin | |

(Continued)

FOREIGN PATENT DOCUMENTS

JP 2001-516955 A 10/2001

*Primary Examiner*—Mary Wilczewski
*Assistant Examiner*—Toniae M Thomas
(74) *Attorney, Agent, or Firm*—Scully, Scott, Murphy & Presser, P.C.; Richard Kotulak, Esq.

(57) ABSTRACT

A junction field effect transistor (JFET) has a hyperabrupt junction layer that functions as a channel of a JFET. The hyperabrupt junction layer is formed by two dopant profiles of opposite types such that one dopant concentration profile has a peak concentration depth at a tail end of the other dopant profile. The voltage bias to the channel is provided by a body that is doped with the same type of dopants as the gate. This is in contrast with conventional JFETs that have a body that is doped with the opposite conductivity type as the gate. The body may be electrically decoupled from the substrate by another reverse bias junction formed either between the body and the substrate or between a buried conductor layer beneath the body and the substrate. The capability to form a thin hyperabrupt junction layer allows formation of a JFET in a semiconductor-on-insulator substrate.

35 Claims, 6 Drawing Sheets

U.S. PATENT DOCUMENTS

2006/0145300 A1 7/2006 Coolbaugh et al.
2007/0212859 A1* 9/2007 Carey et al. ................. 438/487
2008/0272409 A1* 11/2008 Sonkusale et al. ........... 257/287
2009/0179272 A1* 7/2009 Campi et al. ................ 257/365

* cited by examiner

JUNCTION FIELD EFFECT TRANSISTOR WITH A HYPERABRUPT JUNCTION

FIELD OF THE INVENTION

The present invention relates to semiconductor structures and particularly to junction field effect transistors (JFETs) with a hyperabrupt junction and methods of manufacturing and operating the same.

BACKGROUND OF THE INVENTION

Solid state power amplifiers are advantageous for their compact size and easy integration into semiconductor circuit components. Unfortunately, the methods of manufacture for present day semiconductor power amplifiers require a semiconductor substrate dedicated to power amplifier devices or many processing steps in addition to common semiconductor processing steps for typical semiconductor complementary metal-oxide-semiconductor (CMOS) devices or their variants.

For example, high-end power amplifiers are built in gallium arsenide (GaAs) technologies, which require a GaAs substrate and dedicated processing steps that are not compatible with silicon-based CMOS technologies. As a result, the power amplifiers that utilize GaAs technologies tend to be costly. Middle-range power amplifiers are built in modified silicon germanium bipolar complementary metal-oxide-semiconductor (SiGe BiCMOS) technologies developed for high voltage power applications. Even modified SiGe BiCMOS technologies tend to add its own cost associated with enabling power amplifiers. Enabling power amplifiers in standard CMOS technologies also tends to introduce many new processing steps and device modifications to accommodate the high voltages that the power amplifiers require, thus also increasing the manufacturing cost for the power amplifiers.

A junction field effect transistor (JFET) is a semiconductor device in which the current between a source and a drain is controlled by the voltage applied to a junction gate terminal, or a "gate." Unlike a metal-oxide-semiconductor field effect transistor (MOSFET), the gate of a JFET is not insulated from the source and the drain. Instead, the body of the transistor and the gate of the transistor form a reverse-biased pn junction with depletion regions both in the gate and in the body. Therefore, the JFET is a depletion mode device with a high input impedance. The input signal is supplied to the gate, typically in the form of a voltage input. The output is the current between the source and the drain which is modulated by the input voltage at the gate.

A typical JFET comprises a source and a drain that are heavily doped with dopants of a first conductivity type, i.e., p-type or n-type, at a peak dopant concentration typically in the range from about $1.0 \times 10^{20}/cm^3$ to about $3.0 \times 10^{21}/cm^3$. The body of the JEFT is also doped with dopants of the first conductivity type at a dopant concentration typically in the range from about $1.0 \times 10^{17}/cm^3$ to about $1.0 \times 10^{19}/cm^3$. A channel is formed within the body along the pn junction boundary. The gate, located on the body and separated from the source and the drain, is heavily doped with dopants of a second conductivity type, which is the opposite type of the first conductivity type, at a peak dopant concentration typically in the range from about $1.0 \times 10^{20}/cm^3$ to about $3.0 \times 10^{21}/cm^3$. A voltage bias is applied between a gate contact and a body contact to forms a reverse biased pn junction between the gate and the body. The gate contact and the body contact directly contact the gate and the body, respectively, and are typically a metal semiconductor alloy.

On a circuit level, the JFET gate presents a small current load, which is the reverse bias leakage of the gate-to-channel junction. The current load of a JFET, i.e., the gate current, is higher than the current load of a typical MOSFET, since the MOSFET has an extremely low gate current, for example, in the range of picoamperes, due to an insulator between the gate and the channel, i.e., a gate dielectric. However, the gate current of a typical JFET is much lower compared to the base current of a typical bipolar junction transistor (BJT), and the transconductance of a typical JFET is higher than that of a typical MOSFET, enabling handling of a higher current. For this reason, JFETs are used in high-input impedance linear amplifier circuits. Use of JFETs as a switch in power semiconductor circuits is also known.

While the power amplification properties of JFETs are desirable, integration of prior art JFETs into standard CMOS process integration scheme, however, adds many processing steps in a manner similar to other attempts to incorporate power amplifiers into standard semiconductor technologies.

Therefore, there exists a need for a semiconductor structure that provides power amplification, is compatible with standard CMOS technology, and requires a minimal number of additional processing steps, and methods of manufacturing the same.

Specifically, there exists a need for a JFET structure that is compatible with standard CMOS technology and methods of manufacturing the same with a minimal incremental processing cost.

SUMMARY OF THE INVENTION

The present invention addresses the needs described above by providing a semiconductor structure that provides power amplification utilizing commonly used CMOS processing steps at a minimal incremental cost for manufacturing.

Specifically, the present invention provides a junction field effect transistor (JFET) with a hyperabrupt junction layer that functions as a channel of the JFET. The hyperabrupt junction layer is formed by two overlapping dopant profiles of opposite types such that a first dopant concentration profile has a peak concentration depth at a tail end of a second dopant profile. The peak concentration depth of the first dopant profile corresponds to a tail end of the second dopant profile. At the peak concentration depth, the dopant concentration of the first doping profile exceeds the dopant concentration of the second dopant profile. A hyper-abrupt junction is formed as the net dopant concentration sharply changes with depth from one type to the other. The net doping of the hyperabrupt junction layer is of the same conductivity type as the source and the drain of the JFET. The gate and the channel are reverse biased to provide high input impedance for the JFET.

In an aspect of the present invention, the voltage bias to the channel, which is the hyperabrupt junction layer according to the present invention, is provided by a body that is doped with the same type of dopants as the gate. This is in contrast to conventional JFETs that have a body that is doped with the opposite conductivity type as the gate. Preferably, the body is electrically decoupled from the substrate by another reverse bias junction formed either between the body and the substrate or between a buried conductor layer beneath the body and the substrate. The capability to form a thin hyperabrupt junction layer allows formation of a JFET in a semiconductor-on-insulator substrate.

According to the present invention, a semiconductor structure comprises:

a gate of a first conductivity type, wherein the gate is located directly beneath a top surface of a semiconductor substrate;

a source of a second conductivity type, wherein the source is located directly beneath the top surface and abuts the gate, and the second conductivity type is the opposite of the first conductivity type;

a drain of the second conductivity type, wherein the drain is located directly beneath the top surface, abuts the gate, and is disjoined from the source;

a hyperabrupt junction layer of the second conductivity type, wherein the hyperabrupt junction layer is located directly beneath the gate, the source, and the drain; and a body of the first conductivity type, wherein the body is located directly beneath the hyperabrupt junction layer and is disjoined from the gate, the source, and the drain.

The semiconductor substrate may be a bulk substrate, a semiconductor-on-insulator substrate, or a hybrid substrate containing a bulk portion and a semiconductor-on-insulator portion.

The semiconductor structure may further comprise an electrical load connected to the drain or to the source, wherein substantially the same current flows through the source, the hyperabrupt junction layer, the drain, and the electrical load.

Preferably, the semiconductor structure further comprises depletion zones in each of the gate, the hyperabrupt junction layer, and the body. The pn junction between the source and the hyperabrupt junction layer induces a first depletion zone in the gate and a second depletion zone in the hyperabrupt junction layer, wherein the first depletion zone contacts the second depletion zone. The pn junction between the body and the hyperabrupt junction layer induces a third depletion zone in the gate and a fourth depletion zone in the hyperabrupt junction layer, wherein the third depletion zone contacts the fourth depletion zone.

Preferably, the semiconductor structure further comprises:
a gate contact directly contacting the gate;
a source contact directly contacting the source; and
a drain contact directly contacting the drain, wherein each of the gate contact, the source contact, and the drain contact comprise a metal semiconductor alloy.

Preferably, each of the gate contact, the source contact, and the drain contact is separated from the others at least by a metallization blocking dielectric layer or by shallow trench isolation.

The semiconductor structure may further comprise:
a body reachthrough of the first conductivity type, wherein the body reachthrough directly contacts the body and the top surface of the semiconductor substrate; and
a body contact that directly contacts the body reachthrough and comprises a metal semiconductor alloy.

The semiconductor structure may further comprise shallow trench isolation, wherein the shallow trench isolation separates the body reachthrough from the gate, the source, the drain, and the hyperabrupt junction layer.

The source, the gate, and the drain may have a peak dopant concentration, or the maximum dopant concentration in a vertical dopant concentration profile, in the range from about $5.0 \times 10^{19}/cm^3$ to about $5.0 \times 10^{21}/cm^3$, the hyperabrupt junction layer may have a peak dopant concentration in the range from about $1.0 \times 10^{16}/cm^3$ to about $3.0 \times 10^{19}/cm^3$, and the body may have a peak dopant concentration in the range from about $1.0 \times 10^{16}/cm^3$ to about $3.0 \times 10^{19}/cm^3$.

Preferably, each of the source and the drain has a thickness in the range from about 20 nm to about 300 nm, and the hyperabrupt junction layer abuts the gate at a depth in the range from about 15 nm to about 270 nm, and the hyperabrupt junction layer has a thickness in the range from about 15 nm to about 300 nm.

In embodiments wherein the semiconductor substrate has a doping of the second conductivity type, the semiconductor structure may further comprise:
a substrate layer located directly beneath the body and within the semiconductor substrate and having a doping of the second conductivity type; and
a pn junction between the body and the substrate layer.

In embodiments wherein the semiconductor substrate has a doping of the first conductivity type, the semiconductor structure may further comprise:
a buried doped layer of second conductivity type, wherein the buried layer is located directly beneath the body and has a doping of the second conductivity type;
a buried doped layer reachthrough of the second conductivity type, wherein the buried doped layer reachthrough directly contacts the buried doped layer and the top surface of the semiconductor substrate; and
a substrate layer located directly beneath the buried doped layer and within the semiconductor substrate and having a doping of the first conductivity type.

The interface between the body and the buried doped layer is preferably located at a depth in the range from about 80 nm and 1200 nm and the buried doped layer has a peak dopant concentration in the range from about $3.0 \times 10^{16}/cm^3$ to about $5.0 \times 10^{21}/cm^3$.

The hyperabrupt junction layer may comprise a medium-level doped portion at a dopant concentration equal to or above $3.0 \times 10^{17}/cm^3$ and a low-level doped portion at a dopant concentration below $3.0 \times 10^{17}/cm^3$, wherein the low-level doped portion is located directly beneath the medium-level doped portion.

In the case where the semiconductor substrate is a semiconductor-on-insulator (SOI) substrate or an SOI portion of a hybrid substrate, the semiconductor structure further comprises a buried insulator layer directly contacting the body and disjoined from the hyperabrupt junction layer.

The present invention provides a method of manufacturing a semiconductor structure, comprising:
forming a body of the first conductivity type, wherein the body is buried within a semiconductor substrate;
forming a gate of the first conductivity type directly beneath a top surface of the semiconductor substrate;
forming a source and a drain, wherein both of the source and the drain abut the gate, are of a second conductivity type, and are located directly beneath the top surface, the source and the drain do not abut each other, and the second conductivity type is the opposite of the first conductivity type; and
forming a hyperabrupt junction layer of the second conductivity type, wherein the hyperabrupt junction is located directly beneath and abuts the gate, the source, and the drain, and is located directly above the body.

The method may further comprise forming at least one metal-oxide-semiconductor field effect transistor (MOSFET) with a MOSFET source and a MOSFET drain, wherein the source, the drain, and the gate of the inventive JFET are formed during the same processing steps that form the MOSFET source and the MOSFET drain.

The method may further comprise forming a hyperabrupt junction of at least one hyperabrupt junction diode varactor during the same processing step as the formation of the hyperabrupt junction layer.

The hyperabrupt junction layer may be formed by implanting first dopants of the first conductivity type into the hyperabrupt junction layer and implanting second dopants of the second conductivity type into the hyperabrupt junction layer such that the concentration of the second dopants exceeds the dopant concentration of the first dopants.

The method may further comprise forming shallow trench isolation and a body reachthrough of the first conductivity type, wherein the body reachthrough directly contacts the body and the top surface of the semiconductor substrate and the shallow trench isolation separates the body reachthrough from the gate, the source, the drain, and the hyperabrupt junction layer.

The method may further comprise:
forming a buried doped layer of the second conductivity type; and
forming a buried doped layer reachthrough of the second conductivity type, wherein the semiconductor substrate is a bulk substrate and has a doping of the first conductivity type and the buried doped layer reachthrough directly contacts the buried doped layer and the top surface of the semiconductor substrate.

The method may further comprise forming on the surface of the semiconductor substrate a gate contact, a source contact, a drain contact, and a body contact, each of which comprises a metal semiconductor alloy and directly contact the gate, the source, the drain, and the body, respectively and in that order.

The method may further comprise forming a metallization blocking dielectric layer, wherein each of the gate contact, the source contact, the drain contact, and the body contact is separated from the others at least by the metallization blocking dielectric layer or by the shallow trench isolation.

The present invention provides a method of operating a semiconductor structure, which comprises:
providing a semiconductor structure having:
  a gate of a first conductivity type, wherein the gate is located directly beneath a top surface of a semiconductor substrate;
  a source of a second conductivity type, wherein the source is located directly beneath the top surface and abuts the gate, and the second conductivity type is the opposite of the first conductivity type;
  a drain of the second conductivity type, wherein the drain is located directly beneath the top surface, abuts the gate, and is disjoined from the source;
  a hyperabrupt junction layer of the second conductivity type, wherein the hyperabrupt junction layer is located directly beneath the gate, the source, and the drain; and
  a body of the first conductivity type, wherein the body is located directly beneath the hyperabrupt junction layer and is disjoined from the gate, the source, and the drain;
  supplying a voltage bias between the source and the drain; and
amplifying an input electrical signal which is applied between the gate and the body in the form of a current through the source, the hyperabrupt junction layer, and the drain.

In a preferred operation mode, the method may further comprise applying a direct current (DC) voltage bias between the gate and the body to form a reversed biased pn junction between the gate and the hyperabrupt junction layer and a forward biased pn junction between the body and the hyperabrupt junction layer.

In an alternative operation mode, the method may further comprise applying a direct current (DC) voltage bias between the gate and the body to form a forward biased pn junction between the gate and the hyperabrupt junction layer and a reverse biased pn junction between the body and the hyperabrupt junction layer;

The method may further comprise applying a reverse biased pn junction bias between the body and the semiconductor substrate, wherein the semiconductor substrate has a doping of the second conductivity type. Preferably, the semiconductor substrate is a bulk substrate in this case.

Alternatively, the method may further comprise applying a reverse biased pn junction bias between a buried doped layer and the body, wherein the semiconductor structure further comprises the buried doped layer of the second conductivity type separating the body and the semiconductor substrate, and the semiconductor layer has a doping of the first conductivity type. Preferably, the semiconductor substrate is a bulk substrate in this case.

The semiconductor substrate may be a semiconductor-on-insulator substrate containing a buried insulator layer that directly contacts the body.

The input electrical signal may be provided by a semiconductor device located on the semiconductor substrate, wherein the semiconductor device is selected from the group consisting of at least one metal-oxide-semiconductor field effect transistor (MOSFET), at least one bipolar junction transistor, and a combination thereof.

DETAILED DESCRIPTION OF THE INVENTION

Figure 1:
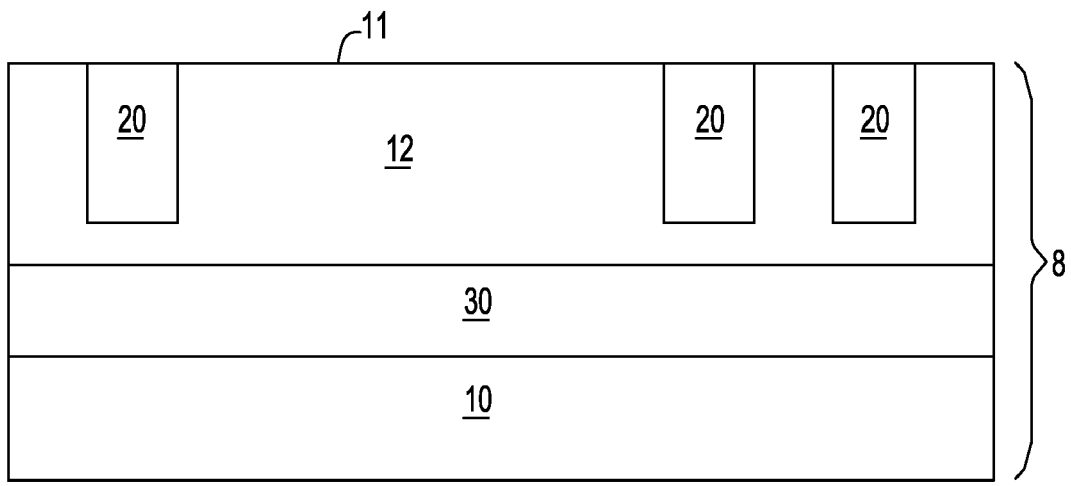
FIGS. 1-4 are sequential vertical cross-sectional views of a first exemplary structure according to the first embodiment of the present invention.

As stated above, the present invention relates to junction field effect transistors (JFETs) with a hyperabrupt junction and methods of manufacturing and operating the same, which are now described in detail with accompanying figures. It is noted that like and corresponding elements are referred to by like reference numerals.

FIGS. 1-4 illustrate an exemplary manufacturing sequence that shows a method of manufacturing the inventive semiconductor structure. Referring to FIG. 1, a semiconductor substrate 8 is provided. Preferably, the semiconductor substrate 8 comprises a standard CMOS substrate material such as silicon, germanium, silicon-germanium alloy, silicon carbon alloy, and silicon-germanium-carbon alloy. However, the present invention may be practiced with a semiconductor substrate 8 with an alternate semiconductor material such as gallium arsenide, indium arsenide, indium phosphide, III-V compound semiconductor materials, II-VI compound semiconductor materials, organic semiconductor materials, and other compound semiconductor materials.

The semiconductor substrate 8 may be a bulk substrate, a semiconductor-on-insulator (SOI) substrate, or a hybrid substrate with both at least one bulk portion and at least one SOI portion. The semiconductor substrate may be p-doped or n-doped with a dopant concentration typically in the range from about $5.0 \times 10^{15}/cm^3$ to about $3.0 \times 10^{17}/cm^3$.

In the first exemplary structure shown in FIG. 1, the semiconductor substrate 8 is a bulk semiconductor substrate. The semiconductor substrate 8 is doped with dopants of the first conductivity type, which may be p-type or n-type. Shallow trench isolation 20 is formed beneath a top surface 11 of the semiconductor substrate 8 along the boundaries of semiconductor devices to be subsequently formed. The methods of forming the shallow trench isolation 20 are well known in the art. A buried doped layer 30 of a second conductivity type is formed within the semiconductor substrate 8 by ion implantation. The second conductivity type is the opposite of the first conductivity type, i.e., the second conductivity type is n-type if the first conductivity type is p-type and vice versa. The species of the ion implantation may be B, $BF_2$, In, Ga, or a combination thereof for a p-type ion implantation, or alternatively, may be P, As, Sb, or a combination thereof for an n-type ion implantation. Typically, the depth of the buried doped layer 30, as measured from the top surface 11 of the semiconductor substrate 8 to the top of the buried doped layer 30 is in the range from about 80 nm to about 1200 nm, and typically in the range from about 300 nm to about 900 nm. The buried doped layer 30 has a peak dopant concentration in the range from about $3.0 \times 10^{16}/cm^3$ to about $5.0 \times 10^{21}/cm^3$, and typically in the range from about $1.0 \times 10^{17}/cm^3$ to about $1.0 \times 10^{21}/cm^3$. The buried doped layer 30 may be a continuous layer that spans across the entire semiconductor substrate 8, or alternatively, may be a patterned layer formed by utilizing a patterned implant mask, such as a photoresist, during the ion implantation. The shallow trench isolation 20 may be formed either prior to or after the formation of the buried doped layer 30.

The ion implantation divides the semiconductor substrate 8 into three portions, which include the buried doped layer 30, an active region 12, and a substrate layer 10. The active region 12 comprises the portion of the semiconductor substrate 8 above the buried doped layer 30. The substrate layer 10 comprises the portion of the semiconductor substrate 8 below the buried doped layer 30. Both the active region 12 and the substrate layer 10 have substantially the same doping as the original doping level of the semiconductor substrate 8 prior to the formation of the buried doped layer 30. The active region 12 excludes the portion of the semiconductor substrate occupied by the shallow trench isolation 20.

Figure 2:
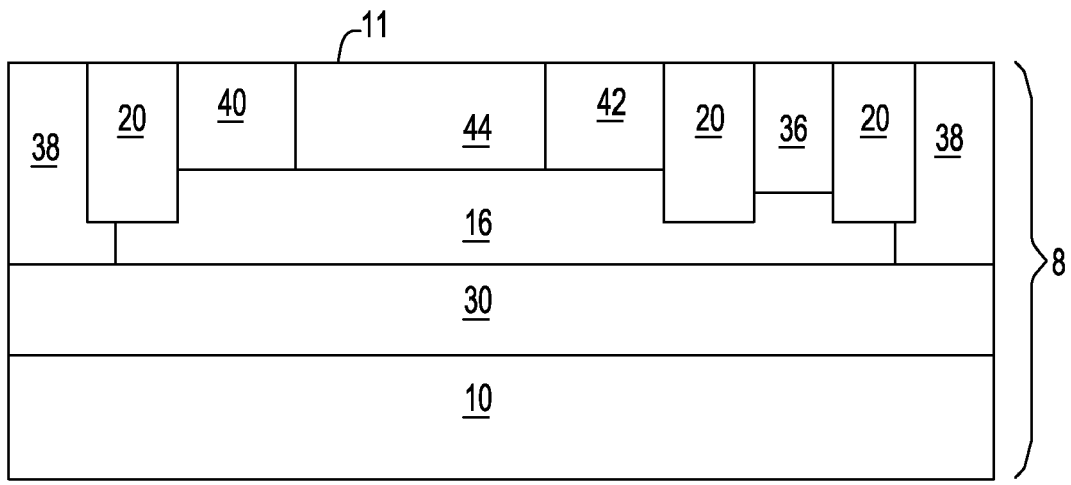

Referring to FIG. 2, various portions of the active region 12 are doped by masked ion implantation steps, thereby forming components of the inventive semiconductor device, for example, at least one body reachthrough 36, at least one buried doped layer reachthrough 38, a source 40, a drain 42, and a gate 44. The portion of the remaining active region between the buried doped layer 30 and the collection of the source 40, the drain 42, and the gate 44 forms a body 16 of the inventive semiconductor device.

The at least one body reachthrough 36 is a heavily doped semiconductor region formed in a portion of the active region 12 by ion implantation of dopants of the first conductivity type. The at least one body reachthrough 36 contacts the body 16. The at least one body reachthrough 36 may comprise one body reachthrough or multiple body reachthroughs. The at least one body reachthrough 36 has a dopant concentration in the range from about $3.0 \times 10^{17}/cm^3$ to about $5.0 \times 10^{21}/cm^3$, and preferably in the range from about $1.0 \times 10^{18}/cm^3$ to about $1.0 \times 10^{21}/cm^3$. The depth of the at least one body reachthrough 36, as measured from the top surface 11 of the semiconductor substrate 8 to the bottom of the at least one body reachthrough 36, is in the range from about 40 nm to about 1200 nm, and preferably in the range from about 100 nm to about 900 nm. Also, the depth of the at least one body reachthrough 36 may be the same as the depth of the gate 44, and may be formed at the same time as the gate 44 to facilitate economical manufacturing. The at least one body reachthrough 36 provides an electrically conductive path to the body 16.

The at least one buried doped layer reachthrough 38 is a heavily doped semiconductor region formed in another portion of the active region 12 by ion implantation of dopants of the second conductivity type. The at least one buried doped layer reachthrough 38 contacts the buried doped layer 30. The at least one buried doped layer reachthrough 38 may comprise one buried doped layer reachthrough or multiple buried doped layer reachthroughs. The at least one buried doped layer reachthrough 38 has a dopant concentration in the range from about $3.0 \times 10^{17}/cm^3$ to about $5.0 \times 10^{21}/cm^3$, and preferably in the range from about $1.0 \times 10^{18}/cm^3$ to about $1.0 \times 10^{21}/cm^3$. The depth of the at least one buried doped layer reachthrough 38, as measured from the top surface 11 of the semiconductor substrate 8 to the bottom of the at least one buried doped layer reachthrough 38, is at least equal to the depth of the buried doped layer 30. The at least one buried doped layer reachthrough 38 provides an electrically conductive path from the top surface 11 of the semiconductor substrate 8 to the buried doped layer 30.

The source 40 and the drain 42 are heavily doped semiconductor regions formed in yet other portions of the active region 12 by ion implantation, i.e., a JFET source and drain implantation, of dopants of the second conductivity type. Both the source 40 and the drain 42 are formed beneath the top surface 11 of the semiconductor substrate 8, i.e., both the top of the source 40 and the top of the drain 42 abut the top surface 11 of the semiconductor substrate 8. The source 40 and the drain 42 do not abut each other, i.e., the source 40 is disjoined from the drain 42. As is typical with dopant concentration profiles of ion implantation processes, the vertical dopant concentration profile of the source 40 and the drain 42 has a peak at a depth below the top surface 11 of the semiconductor substrate 8 and an exponential decrease below a certain depth from the top surface 11. The source 40 and the drain 42 have a thickness, as defined by the vertical distance from the top surface 11 to the depth at which the dopant concentration is two decades lower than the peak concentration, in the range from about 20 nm to about 300 nm, and preferably in the range from about 40 nm to about 150 nm. Both the source 40 and the drain 42 have a peak dopant concentration in the range from about $3.0 \times 10^{19}/cm^3$ to about $5.0 \times 10^{21}/cm^3$, and preferably in the range from about $1.0 \times 10^{20}/cm^3$ to about $1.0 \times 10^{21}/cm^3$.

Optionally, but preferably, at least one metal-oxide-semiconductor field effect transistor (MOSFET, not shown) of the second conductivity type is formed on the semiconductor substrate 8. For example, if the buried doped layer 30 has n-type doping, an n-type MOSFET is formed. Preferably, the source of the second conductivity type MOSFET, or a second conductivity type "MOSFET source," and the drain of the MOSFET, or a second conductivity type "MOSFET drain," are formed during the same processing steps as the source 40 and the drain 42. In other words, the JFET source and drain implantation is performed during the same step as the source and drain implantation of the second conductivity type MOSFET. In this case, the source 40 and the drain 42 have the same depth as the second conductivity type MOSFET source and the second conductivity type MOSFET drain.

The gate 44 is a heavily doped semiconductor region formed in the portion of the active region 12 between the source 40 and the drain 42 by ion implantation, i.e., a JFET gate implantation, of dopants of the first conductivity type. The gate 44 is formed beneath the top surface 11 of the semiconductor substrate 8, i.e., the gate 44 abuts the top surface 11 of the semiconductor substrate 8. The gate 44 abuts both the source 40 and the drain 42. As in the vertical dopant concentration profiles of the source 40 and the drain 42, the vertical dopant concentration profile of the gate 44 has a peak at a depth below the top surface 11 of the semiconductor substrate 8 and an exponential decrease below a certain depth from the top surface 11. The gate 44 has a thickness, as defined by the vertical distance from the top surface 11 to the depth at which the dopant concentration is two decades lower than the peak concentration, in the range from about 20 nm to about 300 nm, and preferably in the range from about 40 nm to about 150 nm. Preferably, the gate 44 has substantially the same thickness as the source 40 and the drain 42. The gate 44 has a peak dopant concentration in the range from about $3.0 \times 10^{19}/cm^3$ to about $5.0 \times 10^{21}/cm^3$, and preferably in the range from about $1.0 \times 10^{20}/cm^3$ to about $1.0 \times 10^{21}/cm^3$.

Optionally, but preferably, at least one MOSFET (not shown) of the first conductivity type is formed on the semiconductor substrate 8. For example, if the semiconductor substrate 8, the gate 44 has p-type doping, a p-type MOSFET is formed. Preferably, the source of the first conductivity type MOSFET, or a first conductivity type MOSFET source, and the drain of the MOSFET, or a first conductivity type MOSFET drain, are formed during the same processing steps as the gate 44. In other words, the JFET gate implantation is performed during the same step as the source and drain implantation of the first conductivity type MOSFET. In this case, the gate 44 has the same depth as the first conductivity type MOSFET source and the first conductivity type MOSFET drain.

The body 16 is formed from a remaining portion of the active region 12 after forming the source 40, the drain 42, the gate 44, the body reachthrough 36, and the buried doped layer reachthrough 38. Prior to any implantation into the body 16, the body has the same doping as the substrate layer 10, i.e., doped with a low-level doping of the first conductivity type. Preferably, dopants of the first conductivity type are implanted into the body 16 such that the peak concentration of the first type dopants in the body has a peak dopant concentration in the range from about $1.0 \times 10^{16}/cm^3$ to about $3.0 \times 10^{19}/cm^3$.

Figure 3:
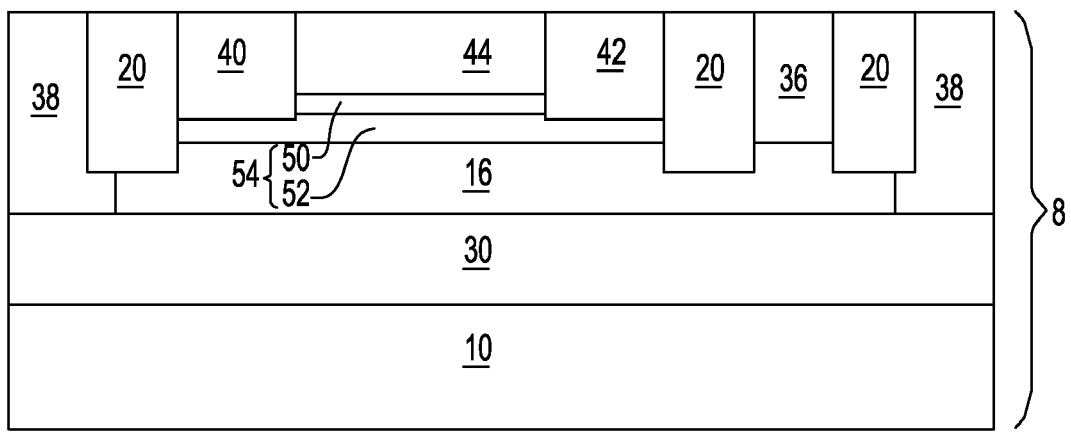

Referring to FIG. 3, a hyperabrupt junction layer 54 is formed by an ion implantation of dopants of the second conductivity type during a hyperabrupt junction implantation. The hyperabrupt junction layer 54 is formed by superposing the dopant concentration profile of the hyperabrupt junction implantation on the exponentially decaying tail of the dopant concentration profile of the JFET gate implantation. The peak concentration of the dopant concentration profile of the hyperabrupt junction is located at a tail end of the dopant concentration profile of the JFET gate implantation. The peak concentration of the dopant concentration profile of the hyperabrupt junction implantation exceeds the dopant concentration at the same depth of the dopant concentration profile of the JFET gate implantation, thus producing the hyper-abruptness of the change in the net dopant concentration profile, i.e., the total dopant concentration profile obtained by subtracting the dopant concentration profile of the JFET gate implantation from dopant concentration profile of the hyperabrupt junction implantation.

The region of the semiconductor substrate 8 in which the net doping is positive, i.e., the amount of dopants from the hyperabrupt junction implantation exceeds the sum of all other dopants of the opposite dopant type, comprises the hyperabrupt junction layer 54. The net doping of the hyperabrupt junction layer 54 is of the same conductivity type as the source and the drain of the JFET, i.e., the net doping of the hyperabrupt junction layer 54 is of the second conductivity type. The hyperabrupt junction layer 54 has a peak dopant concentration, as measured by the net doping, in the range from about $1.0 \times 10^{16}/cm^3$ to about $3.0 \times 10^{19}/cm^3$, and preferably in the range from about $3.0 \times 10^{17}/cm^3$ to about $1.0 \times 10^{19}/cm^3$. If the peak concentration of the hyperabrupt junction layer 54 exceeds $3.0 \times 10^{17}/cm^3$, the hyperabrupt junction layer 54 comprises a medium-level doped portion 50 at a dopant concentration equal to or above $3.0 \times 10^{17}/cm^3$, and a low-level doped portion 52 at a dopant concentration below $3.0 \times 10^{17}/cm^3$. The medium-level doped portion 50 is an upper portion of the hyperabrupt junction layer 54, and the low-level doped portion 52 is a lower portion of the hyperabrupt junction layer 54. The medium-level doped portion 50 is located directly beneath the gate 44. The low-level doped portion 52 is located directly beneath the medium-level doped portion 50, the source 40, and the drain 42.

A hyperabrupt junction is formed at the boundary between the gate 44 and the hyperabrupt junction layer 54. The depth of the hyperabrupt junction, i.e., the vertical distance from the top surface 11 of the semiconductor substrate 8 to the top of the hyperabrupt junction layer 54 is in the range from about 15 nm to about 270 nm, and preferably in the range from about 20 nm to about 100 nm. The hyperabrupt junction layer 54 has a thickness in the range from about 15 nm to about 300 nm, and preferably in the range from about 20 nm to about 100 nm. Preferably, the depth of the hyperabrupt junction is less than the thickness of the gate 44, i.e., the dopant concentration of the hyperabrupt junction implantation exceeds the dopant concentration of the JFET gate implantation above the depth at which the dopant concentration of the JFET gate implantation falls below a level two decades lower than the peak concentration of the JFET gate implantation. In that case, the hyperabrupt junction is located above the original thickness of the gate. The thickness of the gate 44 is therefore reduced from the original thickness.

The term "hyperabrupt junction" is used to denote a type of pn junction in which a dopant concentration profile changes in a controlled non-linear way with density of the dopants increasing towards the junction and abruptly dropping to zero at the junction. Varactors that include an ion-implanted hyperabrupt junction are known in the art as "hyperabrupt junction varactors". See, for example, U.S. Pat. Nos. 4,226,648 to Goodwin, et al., 4,827,319 to Pavlidis, et al, 5,557,140 to Nguyen, et al. and 6,521,506 to Coolbaugh, et al. The methods of forming semiconductor structures including a hyperabrupt junction are described in commonly-assigned, copending U.S. patent application Ser. Nos. 10/905,486 (Pub. No. US2006/0145300A1) and 11/004,877 (Pub. No. US2005/0161770A1), the contents of which are incorporated herein by reference.

Since the hyperabrupt junction layer 54 has a doping of the opposite type as the gate 44 and the body 16, pn junctions are formed between the hyperabrupt junction layer 54 and each of the gate 44 and the body 16. Correspondingly, depletion regions are formed in each of the gate 44, the hyperabrupt junction layer 54, and the body.

Figure 4:
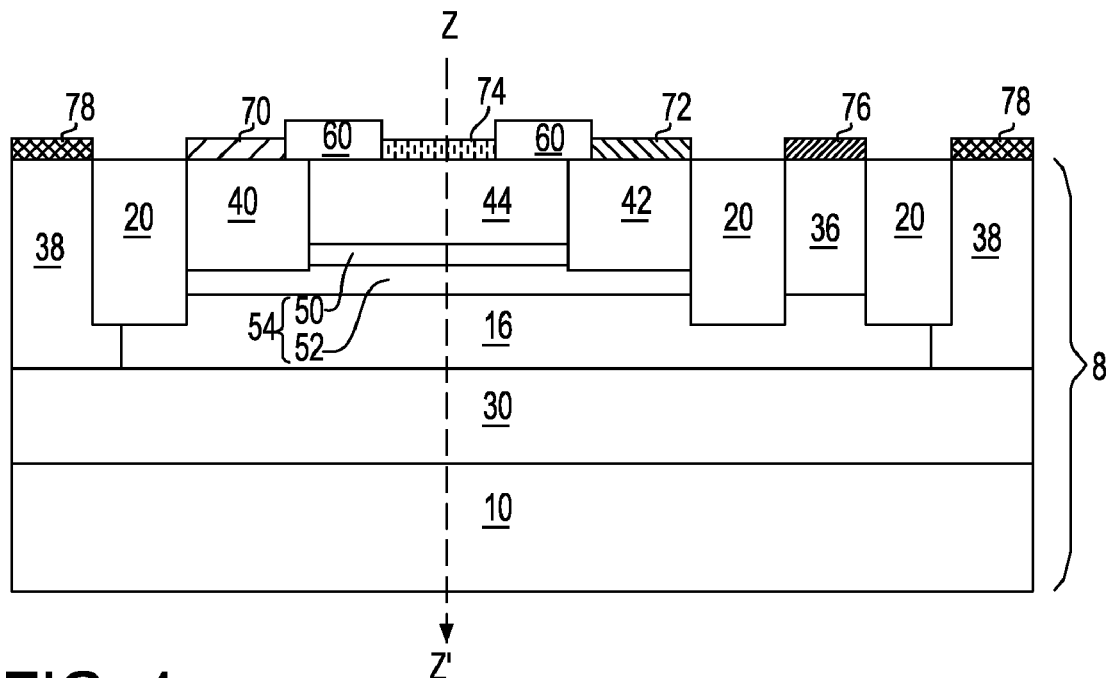

Referring to FIG. 4, a metallization blocking dielectric layer 60 is formed on the top surface 11 of the semiconductor substrate 8 and patterned by lithographic methods and a reactive ion etch. The metallization blocking dielectric layer 60 remains over the portions of the semiconductor substrate 8 on which metallization is not desired, while being removed over the portions of the semiconductor substrate on which metallization is desired, for example, over the source 40, the drain 42, the gate, the at least one body reachthrough 36, and the at least one buried doped layer reachthrough 38. The metallization blocking dielectric layer 60 comprises silicon oxide, or more preferably silicon nitride. The metallization blocking dielectric layer 60 has a thickness in the range from about 10 nm to about 100 nm, and preferably in the range from about 20 nm to about 70 nm.

Metal semiconductor alloys are formed on the exposed semiconductor surfaces by depositing a metal layer (not shown) and reacting the metal layer with the underlying semiconductor material during a metallization process, as is well known in the art. The metal layer typically comprises a conductive metal such as, for example, Ti, Ta, Ni, Co, W, Pd, Pt, Rh, Ir, Au and alloys thereof. The metallization process comprises at least one anneal for semiconductor alloy formation and may comprise multiple anneals to optimize the quality of the semiconductor alloys. The metal layer is subsequently removed, for example, by a wet etch. If the underlying semiconductor material in the semiconductor substrate 8 is silicon, a metal silicide is formed. If the underlying semiconductor material in the semiconductor substrate 8 is an alloy of silicon with other material, a metal silicide alloy is formed. If the other material comprises germanium and/or carbon, the metal silicide alloy comprises a silicide-germanide alloy and/or a silicide-carbide alloy. Some semiconductor material is consumed to provide semiconductor material to the semiconductor alloy during the metallization process.

The metal semiconductor alloys form various contact structures. For example, a source contact 70 is formed directly on the source 40, a drain contact 72 is formed directly on the drain 42, a gate contact 74 is formed directly on the gate 44, a body contact 76 is formed directly on the body reachthrough 36, and a buried doped layer contact 78 is formed directly on the buried doped layer reachthrough 38. Each of the various contact structures are separated from the other contact structures at least by the metallization blocking dielectric layer 60 or by the shallow trench isolation 20. While the different contact structure may be formed by different metallization processes, it is preferred to form the above contact structures during the same processing steps for simplification of the manufacturing sequence.

Figure 5:
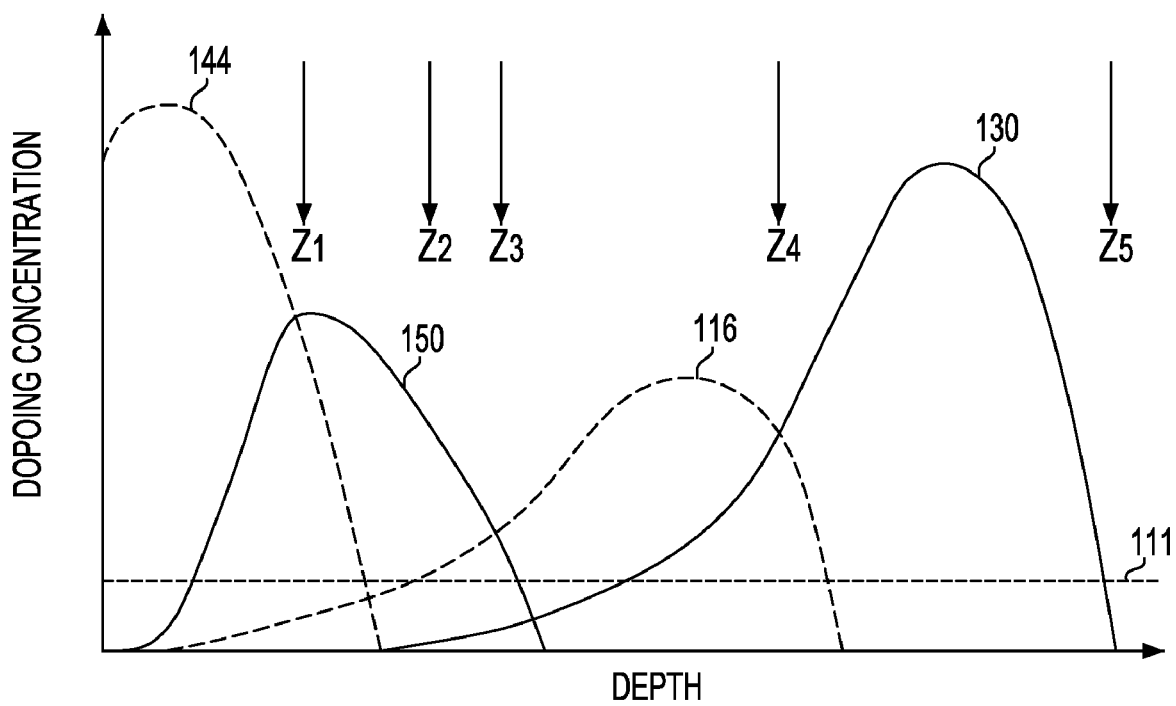
FIG. 5 is a graph showing a dopant concentration profile of the first exemplary structure as a function of the depth from a top surface of a semiconductor substrate in the plane Z-Z' in FIG. 4 according to the first embodiment of the present invention.

Referring to FIG. 5, a schematic total dopant concentration profile shows the individual dopant concentration profiles of the various ion implantation processes as measured from the top surface of the gate 44 along the plane Z-Z' in FIG. 4. The horizontal axis represents the depth from the top surface 11 of the semiconductor substrate 8, with the origin representing the top surface 11. The vertical axis represents the dopant concentration from the various ion implantation processes on a logarithmic scale. The dopant concentration profiles of dopants of the first conductivity type are shown in dotted lines. The dopant concentration profiles of dopants of the second conductivity type are shown in solid lines.

The line 111 represents the original doping level of the semiconductor substrate 8, which is the same as the doping level of the substrate layer 10 located beneath the buried doped layer 30. Typically, the doping level of the semiconductor substrate 8 is typically in the range from about $5.0\times10^{15}/cm^3$ to about $3.0\times10^{17}/cm^3$. The curve 130 represents the dopant concentration profile of the buried doped layer 30, which has a peak dopant concentration in the range from about $3.0\times10^{16}/cm^3$ to about $5.0\times10^{21}/cm^3$, and typically in the range from about $1.0\times10^{17}/cm^3$ to about $1.0\times10^{21}/cm^3$. The curve 116 represents the dopant concentration profile of the body implantation, which has a peak dopant concentration in the range from about $1.0\times10^{16}/cm^3$ to about $3.0\times10^{19}/cm^3$. The curve 144 represents the dopant concentration profile of the JFET gate implantation, which has a peak dopant concentration in the range from about $3.0\times10^{19}/cm^3$ to about $5.0\times10^{21}/cm^3$, and preferably in the range from about $1.0\times10^{20}/cm^3$ to about $1.0\times10^{21}/cm^3$. The curve 150 represents the hyperabrupt junction implantation, which has a peak concentration in the range from about $1.0\times10^{16}/cm^3$ to about $3.0\times10^{19}/cm^3$, and preferably in the range from about $3.0\times10^{17}/cm^3$ to about $1.0\times10^{19}/cm^3$.

FIG. 5 also shows the depths at which the doping type of the semiconductor substrate changes below the gate 44. The hyperabrupt junction is located at the depth $Z_1$, which is in the range from about 15 nm to about 270 nm, and preferably in the range from about 20 nm to about 100 nm. The interface between the hyperabrupt junction layer 54 and the body 16 is located at a depth $Z_3$, which is in the range from about 30 nm to about 570 nm, and preferably in the range from about 40 nm to about 200 nm. Depending on the peak concentration of the hyperabrupt junction implantation, a medium-level doped portion 50 may, or may not, be present in the hyperabrupt junction layer 54. If the medium-level doped portion is present, the depth $Z_2$ of the boundary between the medium-level doped portion 50 and the low-level doped portion 52 is between $Z_1$ and $Z_3$. The depth $Z_4$ of the top of the buried doped layer 30 is in the range from about 80 nm to about 1200 nm, and typically in the range from about 300 nm to about 900 nm. The depth $Z_5$ of the bottom of the buried implant layer is in the range from about 120 nm to about 2400 nm, and typically in the range from about 360 nm to about 2000 nm.

Figure 6:
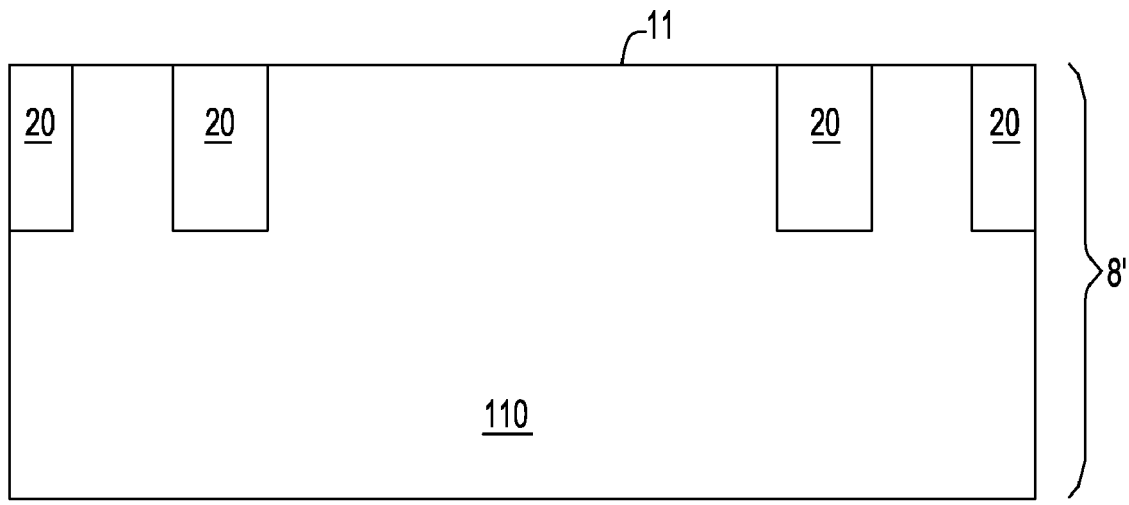
FIGS. 6-9 are sequential vertical cross-sectional views of a second exemplary structure according to the second embodiment of the present invention.

Referring to FIG. 6, a second exemplary semiconductor structure according to a second embodiment of the present invention is shown. The semiconductor substrate 8' is a bulk semiconductor substrate and is doped with dopants of the second conductivity type, which is the opposite conductivity type of a gate of a JFET to be formed subsequently. It is noted that the original semiconductor substrate 8 according to the first embodiment of the present invention has the same doping type as the gate 44, which is the opposite of the second embodiment.

Shallow trench isolation 20 is formed employing the same methods as in the first embodiment. The portion of the semiconductor substrate 8' that is not occupied by the shallow trench isolation comprises a substrate layer 110 at this point.

Figure 7:
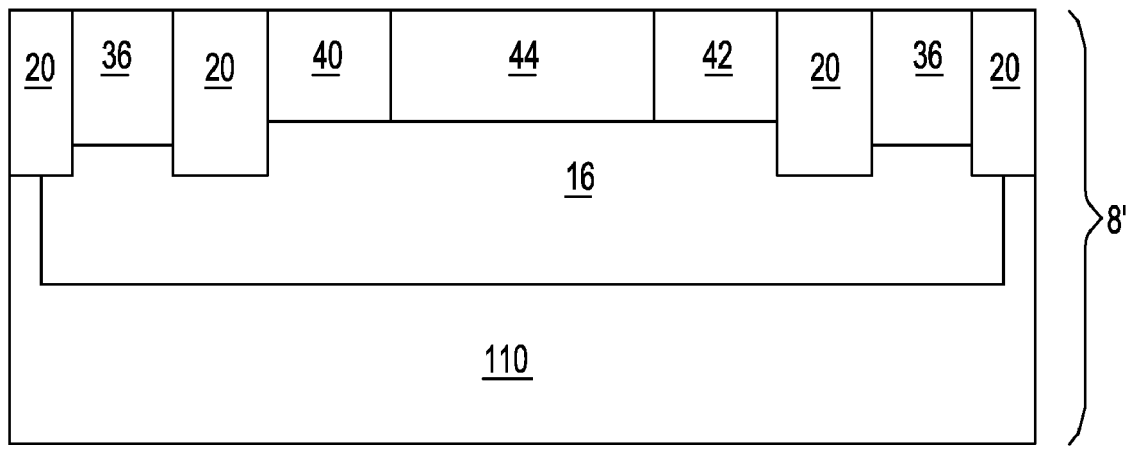

Referring to FIG. 7, various portions of the substrate layer 110 are doped during masked ion implantation steps, thereby forming, for example, at least one body reachthrough 36, a source 40, a drain 42, and a gate 44. The substrate layer 110 is consequently reduced in volume. No buried doped layer is formed in the second exemplary structure. Each of the at least one body reachthrough 36, the source 40, the drain 42, and the gate 44 is formed by the same processing steps and has the same structure as in the first exemplary structure except that the body 16 directly contacts the remaining substrate layer 110 instead of a buried doped layer (which does not exist) in the second embodiment. It is noted that a pn junction is formed between the body 16 and the substrate layer 110 according to the second embodiment of the present invention. In comparison, a pn junction is formed between the body 16 and the buried doped layer 30 according to the first embodiment of the present invention. In both embodiments, a pn junction is formed between the body 16 and a doped semiconductor layer directly underneath.

Both the top of the source 40 and the top of the drain 42 abut the top surface 11 of the semiconductor substrate 8'. The source 40 and the drain 42 do not abut each other, i.e., the source 40 is disjoined from the drain 42. The gate 44 abuts the top surface 11 of the semiconductor substrate 8'. The gate 44 also abuts both the source 40 and the drain 42. Other structural characteristics as the dopant concentration profile and the thickness of the source 40, the drain 42, and the gate 44 are the same as those according to the first embodiment.

Optionally, but preferably, at least one metal-oxide-semiconductor field effect transistor (MOSFET, not shown) of the second conductivity type is formed on the semiconductor substrate 8'. In this case, the JFET source and drain implantation is performed during the same step as the source and drain implantation of the second conductivity type MOSFET. Also optionally, but preferably, at least one MOSFET (not shown) of the first conductivity type is formed on the semiconductor substrate 8'. The JFET gate implantation is performed during the same step as the source and drain implantation of the first conductivity type MOSFET.

Preferably, dopants of the first conductivity type are implanted during a body implantation into the portion of the substrate layer 110 that is located directly beneath the source 40, the drain 42, and the gate 44 such that the amount of doping of the first conductivity type exceeds the doping level of the substrate layer 110, i.e., the original doping level of the semiconductor substrate 8'. The portion of the semiconductor substrate 8' wherein the body implantation level exceeds the original doping level of the semiconductor substrate 8' and thus has a doping of a first conductivity type forms the body 16. The body has a peak dopant concentration in the range from about $1.0 \times 10^{16}/cm^3$ to about $3.0 \times 10^{19}/cm^3$.

Figure 8:
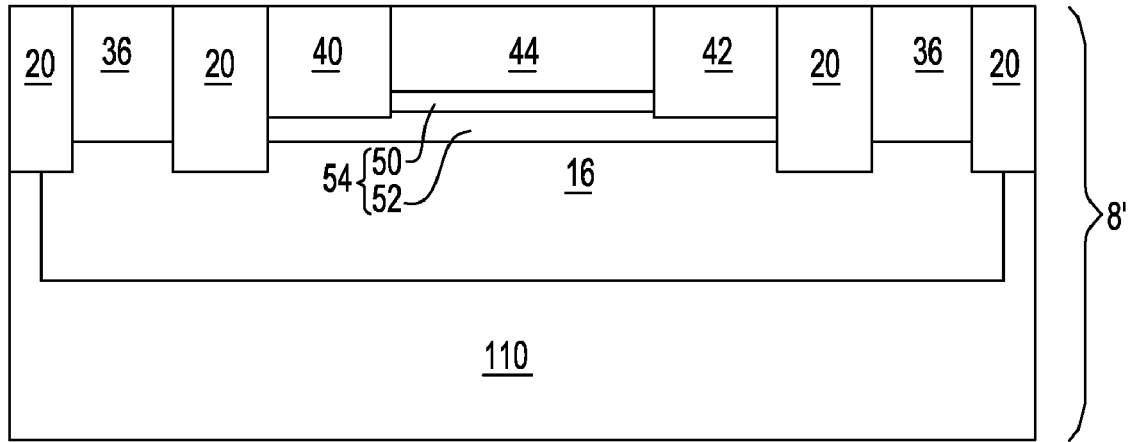

Referring to FIG. 8, a hyperabrupt junction layer 54 is formed using the same processing steps as in the first embodiment of the present invention. The hyperabrupt junction layer 54 has the same structural characteristics as in the first embodiment of the present invention. Also, if the peak concentration of the hyperabrupt junction layer 54 exceeds $3.0 \times 10^{17}/cm^3$, the hyperabrupt junction layer 54 comprises a medium-level doped portion 50 at a dopant concentration equal to or above $3.0 \times 10^{17}/cm^3$ and a low-level doped portion 52 at a dopant concentration below $3.0 \times 10^{17}/cm^3$ as in the first embodiment of the present invention.

Figure 9:
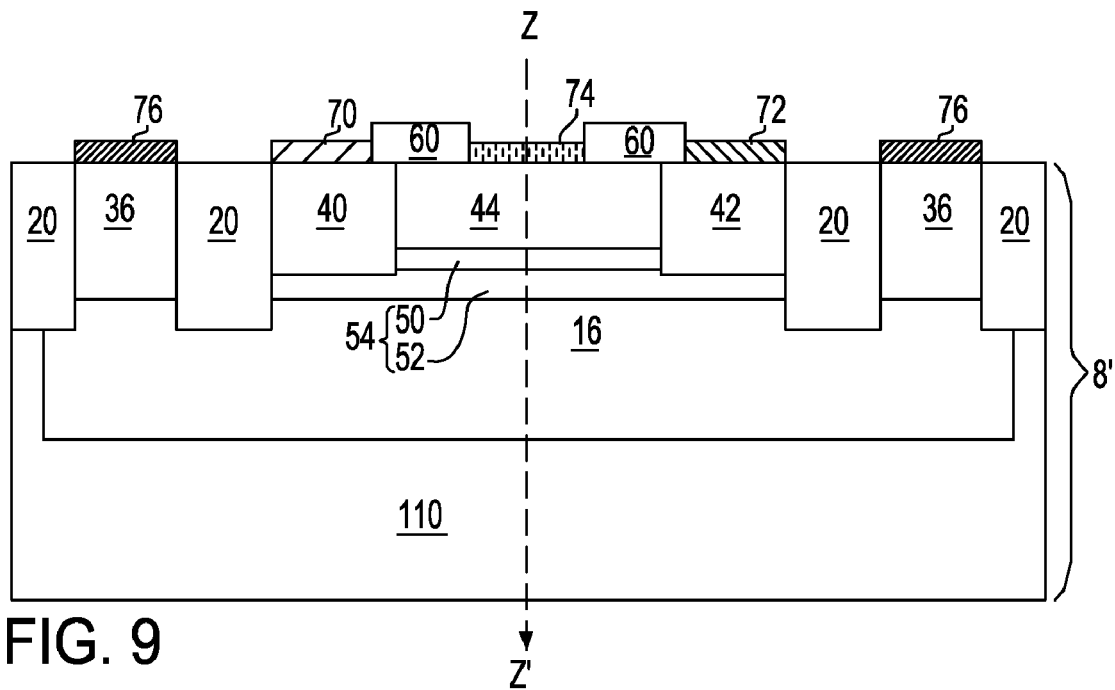

Referring to FIG. 9, a metallization blocking dielectric layer 60 and various contact structures are formed on the semiconductor substrate by employing the same processing steps as in the first embodiment. The various contact structures according to the second embodiment have the same structural characteristics as in the first embodiment as well. Particularly, a source contact 70 is formed directly on the source 40, a drain contact 72 is formed directly on the drain 42, a gate contact 74 is formed directly on the gate 44, and a body contact 76 is formed directly on the body reachthrough 36. Each of the various contact structures are separated from the other contact structures at least by the metallization blocking dielectric layer 60 or by the shallow trench isolation 20.

Figure 10:
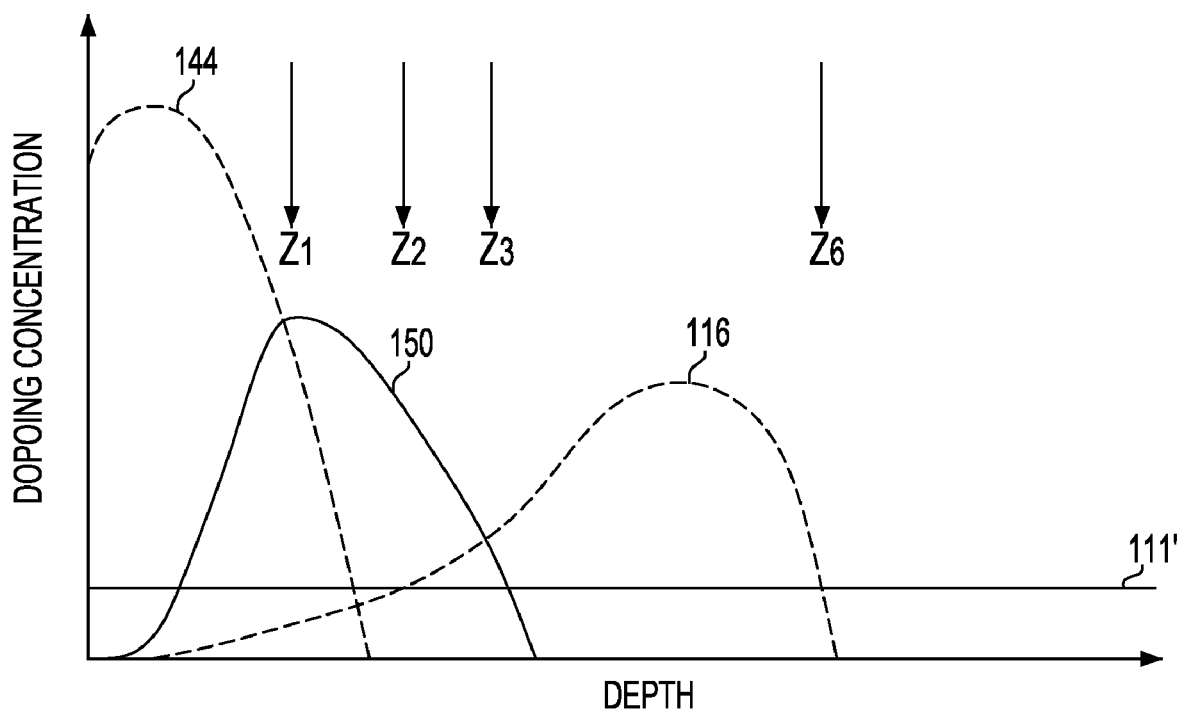
FIG. 10 is a graph showing a dopant concentration profile of the second exemplary structure as a function of the depth from a top surface of a semiconductor substrate in the plane Z-Z' in FIG. 9 according to the second embodiment of the present invention.

Referring to FIG. 10, a schematic total dopant concentration profile shows the individual dopant concentration profiles of the various ion implantation processes as measured from the top surface of the gate 44 along the plane Z-Z' in FIG. 9. The horizontal axis represents the depth from the top surface 11 of the semiconductor substrate 8', with the origin representing the top surface. The vertical axis represents the dopant concentration from the various ion implantation processes on a logarithmic scale. The dopant concentration profiles of dopants of the first conductivity type are shown in dotted lines. The dopant concentration profiles of dopants of the second conductivity type are shown in solid lines.

The line 111' represents the original doping level of the semiconductor substrate 8', which is the same as the doping level of the substrate layer 110 located directly beneath the body 16. Typically, the doping level of the semiconductor substrate 8' is typically in the range from about $5.0 \times 10^{15}/cm^3$ to about $3.0 \times 10^{17}/cm^3$. The curve 116 represents the dopant concentration profile of the body implantation; the curve 144 represents the dopant concentration profile of the JFET gate implantation; and the curve 150 represents the hyperabrupt junction implantation. The dopant concentration profiles for the body implantation, JFET gate implantation, and the hyperabrupt junction implantation according to the second embodiment are the same as those according to the first embodiment of the present invention.

Further, the depth $Z_1$ of the hyperabrupt junction, the depth $Z_3$ of the interface between the hyperabrupt junction layer 54 and the body 16 are the same as in the first embodiment. Depending on the peak concentration of the hyperabrupt junction implantation, a medium-level doped portion 50 may, or may not, be present in the hyperabrupt junction layer 54. If the medium-level doped portion is present, the depth $Z_2$ of the boundary between the medium-level doped portion 50 and the low-level doped portion 52 is between $Z_1$ and $Z_3$. The depth $Z_6$ of the bottom of the body 16 is in the range from about 80 nm to about 1,200 nm, and typically in the range from about 300 nm to about 800 nm.

Figure 11:
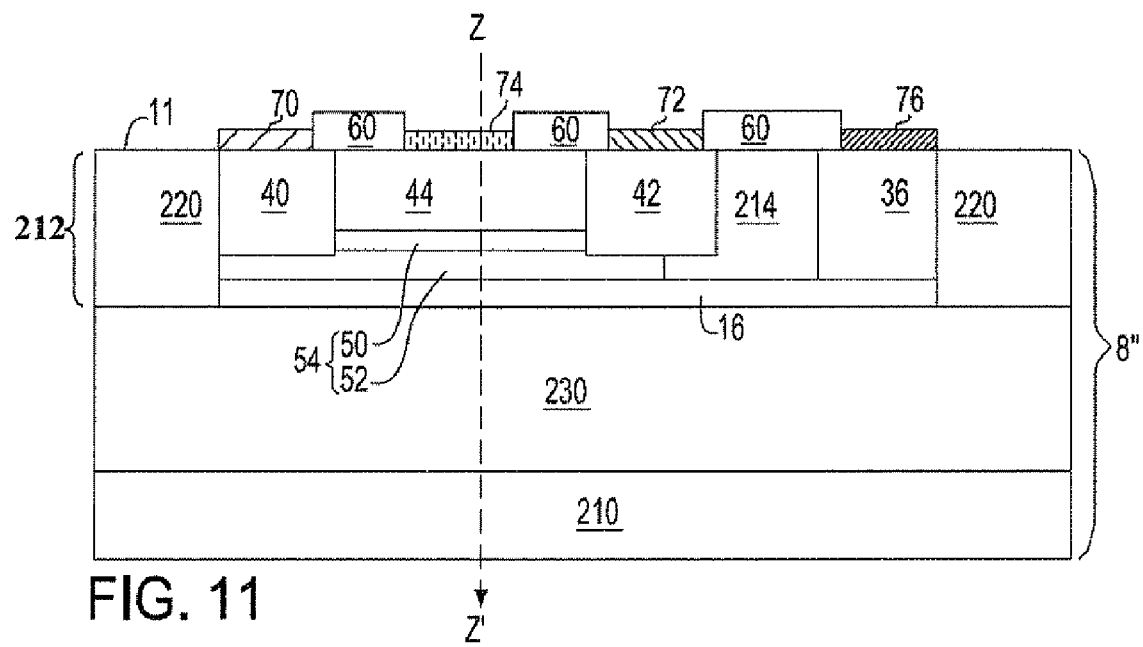
FIG. 11 is a vertical cross-sectional view of a third exemplary structure according to the third embodiment of the present invention.

Referring to FIG. 11, a third exemplary semiconductor structure according to a third embodiment of the present invention is shown. The semiconductor substrate 8" is a semiconductor-on-insulator (SOI) substrate and may have a p-type doping or an n-type doping. The semiconductor substrate 8" comprises a buried insulator layer 230, a substrate layer 210 located beneath the buried insulation layer 230, and a top semiconductor layer 212. The top semiconductor layer 212 comprises shallow trench isolation 220 that contacts the buried insulator layer 230.

A source 40, a drain 42, a gate 44, a body, at least one body reachthrough 36, and the hyperabrupt junction layer 54 are formed by the same processing methods as in the second embodiment of the present invention. The body 16, the at least one body reachthrough 36, and the gate 44 are doped with dopants of the first conductivity type. The source 40, the drain 42, and the hyperabrupt junction layer 54 are doped with dopants of the second conductivity type. Both the top of the source 40 and the top of the drain 42 abut the top surface 11 of the semiconductor substrate 8. The source 40 and the drain 42 do not abut each other, i.e., the source 40 is disjoined from the drain 42. The gate 44 abuts the top surface 11 of the semiconductor substrate 8. The gate 44 also abuts both the source 40 and the drain 42. Other structural characteristics as the dopant concentration profile and the thickness of the source 40, the drain 42, and the gate 44 are the same as those according to the second embodiment.

Preferably, a spacer region 214 is also provided between the at least one body reachthrough 36 and at least one of the source 40, the drain 42, and the gate 44. The spacer region 214 is formed either by not changing the dopant concentration of a portion of the top semiconductor layer 212 from the original dopant concentration of the semiconductor substrate 8", or by counterdoping a portion of the top semiconductor layer 212 to reduce the net doping level. The low doping of the spacer region 214 provides electrical isolation between the at least one body reachthrough 36 and adjacent components of the third exemplary structure.

If the peak concentration of the hyperabrupt junction layer 54 exceeds $3.0 \times 10^{17}/cm^3$, the hyperabrupt junction layer 54 comprises a medium-level doped portion 50 at a dopant concentration equal to or above $3.0 \times 10^{17}/cm^3$ and a low-level doped portion 52 at a dopant concentration below $3.0 \times 10^{17}/cm^3$ as in the second embodiment of the present invention.

Figure 12:
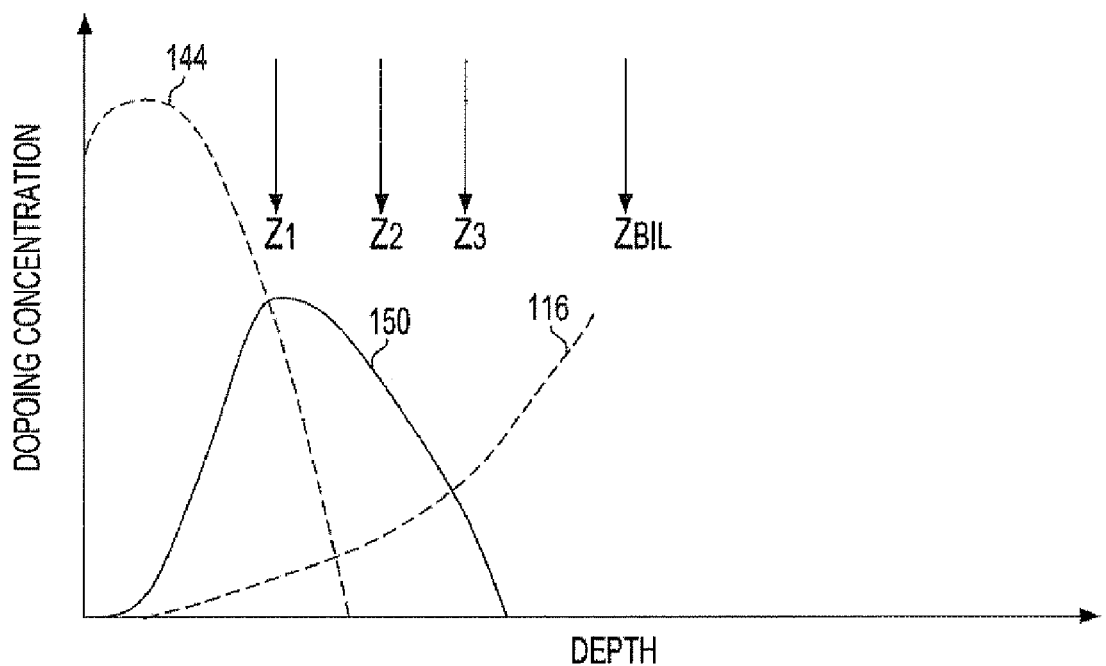
FIG. 12 is a graph showing a dopant concentration profile of the third exemplary structure as a function of the depth from a top surface of a semiconductor substrate in the plane Z-Z' in FIG. 11 according to the third embodiment of the present invention.

Referring to FIG. 12, a schematic total dopant concentration profile shows the individual dopant concentration profiles of the various ion implantation processes as measured from the top surface of the gate 44 along the plane Z-Z' in FIG. 11. The horizontal axis represents the depth from the top surface 11 of the semiconductor substrate 8", with the origin representing the top surface. The vertical axis represents the dopant concentration from the various ion implantation processes on a logarithmic scale. The dopant concentration profiles of dopants of the first conductivity type are shown in dotted lines. The dopant concentration profiles of dopants of the second conductivity type are shown in solid lines.

The curve 116 represents the dopant concentration profile of the body implantation; the curve 144 represents the dopant concentration profile of the JFET gate implantation; and the curve 150 represents the hyperabrupt junction implantation. The dopant concentration profiles for the body implantation, JFET gate implantation, and the hyperabrupt junction implantation according to the third embodiment are the same as those according to the first embodiment of the present invention. The original doping level (not shown) of the semiconductor substrate 8", which is the same as the doping level of the substrate layer 210 located directly beneath the buried insulator layer 230, may be of the first conductivity type or of the second conductivity type. Typically, the doping level of the semiconductor substrate 8" is typically in the range from about $5.0 \times 10^{15}/cm^3$ to about $3.0 \times 10^{17}/cm^3$.

Further, the depth $Z_1$ of the hyperabrupt junction, the depth $Z_3$ of the interface between the hyperabrupt junction layer 54 and the body 16 are the same as in the first embodiment. Depending on the peak concentration of the hyperabrupt junction implantation, a medium-level doped portion 50 may, or may not, be present in the hyperabrupt junction layer 54. If the medium-level doped portion is present, the depth $Z_2$ of the boundary between the medium-level doped portion 50 and the low-level doped portion 52 is between $Z_1$ and $Z_3$. The bottom of the body 16 coincides with the top of the buried insulator layer 230, of which the depth $Z_{BIL}$ is in the range from about 50 nm to about 300 nm, and typically in the range from about 80 nm to about 200 nm.

Figure 13:
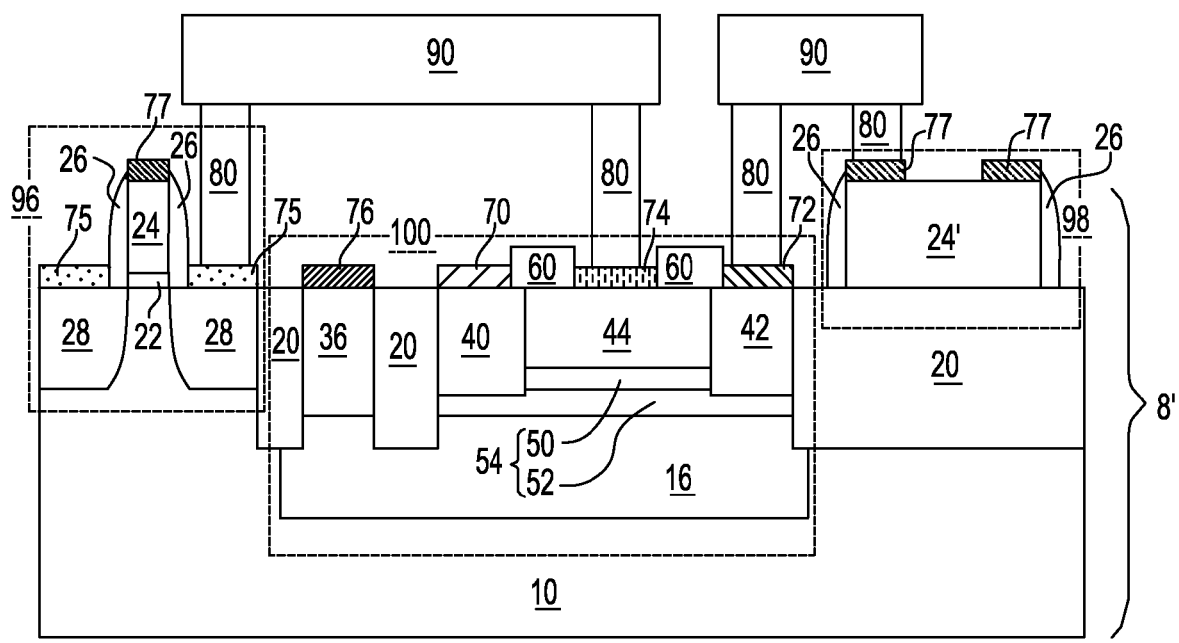
FIG. 13 is a vertical cross-sectional view of a fourth exemplary structure according to the present invention.

The operation of the inventive semiconductor structures according to the present invention is described herein with a fourth exemplary structure shown in FIG. 13. The fourth exemplary structure includes an inventive semiconductor structure, which is herein referred to as an "exemplary inventive JFET" 100. While the exemplary inventive JFET 100 is a structure according to the second embodiment of the present invention, another structure according to the first or third embodiment of the present invention may be substituted for the exemplary inventive JFET and operated in the same way. The fourth exemplary structure further includes a MOSFET 96 and a polysilicon resistor 98. The MOSFET 96 comprises a gate dielectric 22, a gate polysilicon 24, a gate spacer 26, a source and drain region 28, a source and drain silicide 75, and a gate silicide 77. The polysilicon resistor 98 comprises a doped polysilicon 24', which typically comprises the same material as the gate polysilicon 24, a gate spacer 26, and gate silicides 77.

The exemplary inventive JFET 100 functions as a switch or a signal amplifier. The gate contact 74 or the body contact 76 is an input terminal of the exemplary inventive JFET 100. The source 40 or the drain 42 provides a current output of the exemplary inventive JFET 100. The input signal is provided across the gate 44 and the body 16, both of which are doped with the same type of dopants, i.e., dopants of the first conductivity type. The channel of the exemplary inventive JFET comprises a hyperabrupt junction layer 54, which is doped with dopants of the second conductivity type. A reverse biased pn junction is formed between the body 16 and the hyperabrupt junction layer 54, or preferably, between the gate 44 and the hyperabrupt junction layer. The terminal with the reverse biased pn junction with respect to the hyperabrupt junction layer 54, i.e., the gate 44 or the body 16, is the input terminal that has a high input impedance. Preferably, the gate 44 is the input terminal. In some applications, however, the body 16 may function as the input terminal instead. Either the source 40 or the drain 42 functions as an output terminal that provides a current output.

In the fourth exemplary structure, a source or a drain of the MOSFET 96 provides an input signal to the gate 44 of the exemplary inventive JFET 100 through contact vias 80 and an M1 level wire 90. Similarly, the output current of the exemplary inventive JFET 100 is supplied into the polysilicon resistor 98 through other contact vias 80 and another M1 level wire 90. The MOSFET 96 is provided in the description of the present invention only as a non-limiting example of a standard semiconductor device that can provide an input to the JFET 100. Also, the polysilicon resistor 98 is provided herein only as a non-limiting example of a standard semiconductor device that utilize an output current from the JFET 100. One of ordinary skill in the art would recognize that the input to the exemplary inventive JFET 100 may be provided by a CMOS device, a bipolar semiconductor device, a BiCMOS device, or a SiGe BiCMOS device formed on the same semiconductor substrate (8, 8', or 8") in any of the three embodiments of the present invention described above. Similarly, the output of the exemplary inventive JFET 100 may be supplied into any other standard semiconductor devices or even into an output pad that may be connected to an external load component separated from the semiconductor substrate (8, 8', or 8"). Therefore, the use of the MOSFET 96 and the polysilicon resistor 98 in the description of the present invention does not limit the application of the present invention to the fourth exemplary structures in any way, but serves as a demonstration of the practicability of the present invention. Utilization of other semiconductor components for input devices and output devices attached to an inventive JFET of any one of the three embodiments of the present invention is within the knowledge of one of ordinary skill in the art, and is herein explicitly contemplated.

In an aspect, the inventive JFET may be used for power amplification. Further, the manufacturing process of the inventive JFET is compatible with standard CMOS processing steps. Unlike conventional JFETs, however, the body 16 is doped with dopants of the same type as the gate 44, that is, with dopants of the first conductivity type, i.e. either p-type or n-type. The hyperabrupt junction layer 54, which is the channel of the inventive JFET, is doped with dopants of both types. However, the amount of active dopants of the second conductivity type, i.e., n-type or p-type, exceeds the amount of active dopants of the first conductivity type, i.e., p-type or n-type.

During the operation of the inventive JFET from any one of the three embodiments of the present invention, a voltage bias is supplied between the source 40 and the drain 42 and an input electrical signal applied between the gate 44 and the body 16 is amplified in the form of a current through the source 40, the hyperabrupt junction layer 54, and the drain 42.

In one operation mode, a direct current (DC) voltage bias may be applied between the gate 44 and the body 16 to form a reversed biased pn junction between the gate 44 and the hyperabrupt junction layer 54 and a forward biased pn junction between the body 16 and the hyperabrupt junction layer 54. In an alternate operation mode, a direct current (DC) voltage bias may be applied between the gate 44 and the body 16 to form a forward biased pn junction between the gate 44 and the hyperabrupt junction layer 54 and a reverse biased pn junction between the body 16 and the hyperabrupt junction layer 54.

Preferably, the exemplary inventive JFET is electrically isolated from the substrate layer (10, 110, or 210). The electrical isolation may be provided by a reversed biased pn junction between the buried doped layer 30 and the substrate layer 10 in semiconductor structures according to the first embodiment of the present invention. The electrical isolation may be provided by a reversed biased pn junction between the body 16 and the substrate layer 110 in semiconductor structures according to the second embodiment of the present invention. The electrical isolation may be provided by a buried insulator layer 230 in semiconductor structures according to the third embodiment of the present invention. The body 16 and the substrate layer 10 of the first embodiment has a doping of the first conductivity type, while the buried doped layer 30 and the substrate layer 110 of the second embodiment has a doping of the second conductivity type.

The input electrical signal may be provided by any semiconductor device, and particularly by at least one MOSFET, at least one bipolar junction transistor (BJT), or a circuit containing a combination thereof. Similarly, the output current may be supplied to any semiconductor device, and particularly by at least one MOSFET, at least one bipolar junction transistor, a resistor, an inductor, a capacitor, a light emitting diode, or a circuit containing a combination thereof.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a gate of a first conductivity type, wherein said gate is located directly beneath a top surface of a semiconductor substrate;
   a source of a second conductivity type, wherein said source is located directly beneath said top surface and abuts said gate, and said second conductivity type is the opposite of said first conductivity type;
   a drain of said second conductivity type, wherein said drain is located directly beneath said top surface, abuts said gate, and is disjoined from said source;
   a hyperabrupt junction layer of said second conductivity type, wherein said hyperabrupt junction layer includes an upper portion and a lower portion, and said upper portion is located directly beneath said gate, and said lower portion is located directly beneath said upper portion, said source, and said drain; and
   a body of said first conductivity type, wherein said body is located directly beneath said hyperabrupt junction layer and is disjoined from said gate, said source, and said drain.

2. The semiconductor structure of claim 1, further comprising an electrical load connected to said drain or to said source, wherein substantially the same current may flow through said source, said hyperabrupt junction layer, said drain, and said electrical load.

3. The semiconductor structure of claim 1, further comprising a depletion zones in each of said gate, said hyperabrupt junction layer, and said body.

4. The semiconductor structure of claim 1, further comprising:
   a gate contact directly contacting said gate;
   a source contact directly contacting said source; and
   a drain contact directly contacting said drain, wherein each of said gate contact, said source contact, and said drain contact comprise a metal semiconductor alloy.

5. The semiconductor structure of claim 4, wherein each of said gate contact, said source contact, and said drain contact is separated from the others at least by a metallization blocking dielectric layer or by shallow trench isolation.

6. The semiconductor structure of claim 1, further comprising:
   a body reachthrough of said first conductivity type, wherein said body reachthrough directly contacts said body and said top surface of said semiconductor substrate; and
   a body contact that directly contacts said body reachthrough and comprises a metal semiconductor alloy.

7. The semiconductor structure of claim 6, further comprising shallow trench isolation, wherein said shallow trench isolation separates said body reachthrough from said gate, said source, said drain, and said hyperabrupt junction layer.

8. The semiconductor structure of claim 1, wherein said semiconductor substrate comprises a material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

9. The semiconductor structure of claim 1, wherein said source, said gate, and said drain have a peak dopant concentration in the range from about $5.0 \times 10^{19}/cm^3$ to about $5.0 \times 10^{21}/cm^3$, said hyperabrupt junction layer has a peak dopant concentration in the range from about $1.0 \times 10^{16}/cm^3$ to about $3.0 \times 10^{19}/cm^3$, and said body has a peak dopant concentration in the range from about $1.0 \times 10^{16}/cm^3$ to about $3.0 \times 10^{19}/cm^3$.

10. The semiconductor structure of claim 1, wherein each of said source and said drain has a thickness in the range from about 20 nm to about 300 nm, and said hyperabrupt junction layer abuts said gate at a depth in the range from about 15 nm to about 270 nm, and said hyperabrupt junction layer has a thickness in the range from about 15 nm to about 300 nm.

11. The semiconductor structure of claim 1, further comprising:
   a substrate layer located directly beneath said body and within said semiconductor substrate and having a doping of said second conductivity type; and
   a pn junction between said body and said substrate layer.

12. The semiconductor structure of claim 1, further comprising:
   a buried doped layer of second conductivity type, wherein said buried layer is located directly beneath said body and has a doping of said second conductivity type;

a buried doped layer reachthrough of said second conductivity type, wherein said buried doped layer reachthrough directly contacts said buried doped layer and said top surface of said semiconductor substrate; and a substrate layer located directly beneath said buried doped layer and within said semiconductor substrate and having a doping of said first conductivity type.

13. The semiconductor structure of claim 12, wherein the interface between said body and said buried doped layer is located at a depth in the range from about 80 nm and 1200 nm and said buried doped layer has a peak dopant concentration in the range from about $3.0 \times 10^{16}/cm^3$ to about $5.0 \times 10^{21}/cm^3$.

14. The semiconductor structure of claim 1, wherein said hyperabrupt junction layer comprises a medium-level doped portion at a dopant concentration equal to or above $3.0 \times 10^{17}/cm^3$ and a low-level doped portion at a dopant concentration below $3.0 \times 10^{17}/cm^3$, wherein said low-level doped portion is located directly beneath said medium-level doped portion.

15. A semiconductor structure comprising:
 a gate of a first conductivity type, wherein said gate is located directly beneath a top surface of a semiconductor-on-insulator substrate;
 a source of a second conductivity type, wherein said source is located directly beneath said top surface and abuts said gate, and said second conductivity type is the opposite of said first conductivity type;
 a drain of said second conductivity type, wherein said drain is located directly beneath said top surface, abuts said gate, and is disjoined from said source;
 a hyperabrupt junction layer of said second conductivity type, wherein said hyperabrupt junction layer includes an upper portion and a lower portion, and said upper portion is located directly beneath and abuts said gate, and said lower portion is located directly beneath said upper portion, said source, and said drain;
 a body of said first conductivity type, wherein said body is located directly beneath said hyperabrupt junction layer and is disjoined from said gate, said source, and said drain; and
 a buried insulator layer directly contacting said body and disjoined from said hyperabrupt junction layer.

16. The semiconductor structure of claim 15, further comprising:
 a gate contact directly contacting said gate;
 a source contact directly contacting said source; and
 a drain contact directly contacting said drain, wherein each of said gate contact, said source contact, and said drain contact comprise a metal semiconductor alloy.

17. The semiconductor structure of claim 15, further comprising:
 a body reachthrough of said first conductivity type, wherein said body reachthrough directly contacts said body and said top surface of said semiconductor substrate; and
 a body contact that directly contacts said body reachthrough and comprises a metal semiconductor alloy.

18. The semiconductor structure of claim 16, wherein said source, said gate, and said drain have a peak dopant concentration in the range from about $5.0 \times 10^{19}/cm^3$ to about $5.0 \times 10^{21}/cm^3$, said hyperabrupt junction layer has a peak dopant concentration in the range from about $1.0 \times 10^{16}/cm^3$ to about $3.0 \times 10^{19}/cm^3$, and said body has a peak dopant concentration in the range from about $1.0 \times 10^{16}/cm^3$ to about $3.0 \times 10^{19}/cm^3$.

19. The semiconductor structure of claim 18, further comprising shallow trench isolation, wherein said shallow trench isolation separates said body reachthrough from said gate, said source, said drain, and said hyperabrupt junction layer.

20. The semiconductor structure of claim 16, wherein each of said source and said drain has a thickness in the range from about 20 nm to about 300 nm, and said hyperabrupt junction layer abuts said gate at a depth in the range from about 15 nm to about 270 nm, and said hyperabrupt junction layer has a thickness in the range from about 15 nm to about 300 nm.

21. The semiconductor structure of claim 16, wherein said hyperabrupt junction layer comprises a medium-level doped portion at a dopant concentration equal to or above $3.0 \times 10^{17}/cm^3$ and a low-level doped portion at a dopant concentration below $3.0 \times 10^{17}/cm^3$, wherein said low-level doped portion is located directly beneath said medium-level doped portion.

22. A method of manufacturing a semiconductor structure, comprising:
 forming a body of said first conductivity type, wherein said body is buried within a semiconductor substrate;
 forming a gate of said first conductivity type directly beneath a top surface of said semiconductor substrate;
 forming a source and a drain, wherein both of said source and said drain abut said gate, are of a second conductivity type, and are located directly beneath said top surface, said source and said drain do not abut each other, and said second conductivity type is the opposite of said first conductivity type; and
 forming a hyperabrupt junction layer of said second conductivity type, wherein said hyperabrupt junction includes an upper portion and a lower portion, and said upper portion is located directly beneath and abuts said gate, and said lower portion is located directly beneath said upper portion, said source, and said drain, and is located directly above said body.

23. The method of claim 22, further comprising forming at least one metal-oxide-semiconductor field effect transistor (MOSFET) with a MOSFET source and a MOSFET drain, wherein said source, said drain, and said gate are formed during the same processing steps that form said MOSFET source and said MOSFET drain.

24. The method of claim 22, further comprising forming a hyperabrupt junction of at least one metal-oxide-semiconductor (MOS) hyperabrupt junction varactor during the same processing step as said formation of said hyperabrupt junction layer.

25. The method of claim 22, wherein first dopants of said first conductivity type are implanted into said hyperabrupt junction layer and second dopants of said second conductivity type are implanted into said hyperabrupt junction layer such that the concentration of said second dopants exceeds the dopant concentration of said first dopants.

26. The method of claim 22, further comprising forming shallow trench isolation and a body reachthrough of said first conductivity type, wherein said body reachthrough directly contacts said body and said top surface of said semiconductor substrate and said shallow trench isolation separates said body reachthrough from said gate, said source, said drain, and said hyperabrupt junction layer.

27. The method of claim 22, further comprising:
 forming a buried doped layer of said second conductivity type; and
 forming a buried doped layer reachthrough of said second conductivity type, wherein said semiconductor substrate is a bulk substrate and has a doping of said first conductivity type and said buried doped layer reachthrough directly contacts said buried doped layer and said top surface of said semiconductor substrate.

28. The method of claim 22, further comprising forming on said surface of said semiconductor substrate a gate contact, a source contact, a drain contact, and a body contact, each of which comprises a metal semiconductor alloy and directly contact said gate, said source, said drain, and said body, respectively and in that order.

29. A method of operating a semiconductor structure, comprising:
providing a semiconductor structure having:
a gate of a first conductivity type, wherein said gate is located directly beneath a top surface of a semiconductor substrate;
a source of a second conductivity type, wherein said source is located directly beneath said top surface and abuts said gate, and said second conductivity type is the opposite of said first conductivity type;
a drain of said second conductivity type, wherein said drain is located directly beneath said top surface, abuts said gate, and is disjoined from said source;
a hyperabrupt junction layer of said second conductivity type, wherein said hyperabrupt junction layer includes an upper portion and a lower portion, and said upper portion is located directly beneath said gate, and said lower portion is located directly beneath said upper portion, said source, and said drain; and
a body of said first conductivity type, wherein said body is located directly beneath said hyperabrupt junction layer and is disjoined from said gate, said source, and said drain;
supplying a voltage bias between said source and said drain; and
amplifying an input electrical signal which is applied between said gate and said body in the form of a current through said source, said hyperabrupt junction layer, and said drain.

30. The method of claim 29, further comprising applying a direct current (DC) voltage bias between said gate and said body to form a reversed biased pn junction between said gate and said hyperabrupt junction layer and a forward biased pn junction between said body and said hyperabrupt junction layer.

31. The method of claim 29, further comprising applying a direct current (DC) voltage bias between said gate and said body to form a forward biased pn junction between said gate and said hyperabrupt junction layer and a reverse biased pn junction between said body and said hyperabrupt junction layer.

32. The method of claim 29, further comprising applying a reverse biased pn junction bias between said body and said semiconductor substrate, wherein said semiconductor substrate has a doping of said second conductivity type.

33. The method of claim 29, further comprising applying a reverse biased pn junction bias between a buried doped layer and said body, wherein said semiconductor structure further comprises said buried doped layer of said second conductivity type separating said body and said semiconductor substrate, and said semiconductor layer has a doping of said first conductivity type.

34. The method of claim 29, wherein said semiconductor substrate is a semiconductor-on-insulator substrate containing a buried insulator layer that directly contacts said body.

35. The method of claim 29, wherein said input electrical signal is provided by a semiconductor device located on the said semiconductor substrate, wherein said semiconductor device is selected from the group consisting of at least one metal-oxide-semiconductor field effect transistor (MOSFET), at least one bipolar junction transistor, and a combination thereof.

* * * * *